Sept. 12, 1967 E. SIRTL 3,341,374

PROCESS OF PYROLYTICALLY GROWING EPITAXIAL SEMICONDUCTOR LAYERS UPON HEATED SEMICONDUCTOR SUBSTRATES

Filed May 7, 1964

3,341,374

PROCESS OF PYROLYTICALLY GROWING EPITAXIAL SEMICONDUCTOR LAYERS UPON HEATED SEMICONDUCTOR SUBSTRATES

Erhard Sirtl, Munich, Germany, assignor to Siemens & Halske Aktiengesellschaft, Berlin and Munich, Germany, a corporation of Germany Filed May 7, 1964, Ser. No. 365,573
Claims priority, application Germany, May 9, 1963, S 85,119
15 Claims. (Cl. 148—175)

ABSTRACT OF THE DISCLOSURE

The invention relates to a process of producing semiconductor materials by thermally or pyrolytically dissociating a gaseous semiconductor compound thereby precipitating a semiconductor material upon a heated substrate of the same semiconductor material. The semiconductor members are silicon and germanium. During the first stage, a mechanical cover or spacer structure remains in a quasi-stationary condition above a heated subtrate surface. This results in removal of damaged portions of the substrate surface. Thereafter, the cover is removed in a second processing stage, within the same vessel, to that the equilibrium conditions at the heated substrate are now such that by thermal dissociation of the gaseous semiconductor compound, precipitation of semiconductor material occurs upon the substrate surface.

My invention relates to the production of semiconductor members by thermal dissociation and precipitation of semiconductor material from the gaseous phase upon a preferably monocrystalline substrate of the same material, thus growing an epitaxial layer on the substrate.

In such processes, the surface constitution of the substrate, particularly of a flat disc or wafer, is of importance to the quality of the product obtained. Mechanically polished substrates possess a surface layer which is considerably damaged by the effect of the abrasive grinding matrial. It is therefore necessary in most cases to subsequently remove the so-called "damage layer." Treating such specimens with etching liquid does not, or not reliably, result in an ultimate surface of the desired degree of perfection. That is, the etched surface is not always sufficiently planar and often too rough. Etching by chemical attack of gas likewise fails to produce satisfactory surfaces on substrates having the shape of a flat disc or wafer because the removal of material by the flow of gaseous etchant is not uniform over the entire expanse of the surface.

It is an object of my invention to obviate difficulties of the above-mentioned kind and to provide a method of increased reliability for producing high-quality planar epitaxial layers upon flat substrates of semiconductor material.

To achieve this object, and the mose specific objects that will be apparent hereinafter, the process of producing semiconductor members by thermally dissociating a gaseous semiconductor compound and precipitating the semiconductor material upon a heated substrate of the same semiconductor material is carried out as follows. During a first stage of the process, the reaction at the heated substrate surface is adjusted and maintained by mechanical cover or spacer structure to remain in a quasi-stationary condition in which the semiconductor material of the substrate surface is dissolved, thus eliminating any damaged portions of the surface. Thereafter, the reaction equilibrium within the same processing vessel is changed by removing the mechanical cover or partitioning structure, so that now, during a second processing stage, the equilibrium conditions at the heated substrate surface are those required for thermal dissociation of the gaseous semiconductor compound and precipitation of the evolving semiconductor material upon the substrate surface.

According to another feature of my invention the quasi-stationary material-dissolving condition during the first reaction stage is produced by disposing above the substrate surface a movable cover plate whose bottom surface is only slightly spaced from the top surface of the substrate, preferably a distance of 0.1 to 1 mm., the cover plate, particularly its bottom surface, being planar and extending accurately in parallel relation to the substrate surface. During the second reaction stage, the cover plate is removed to a different position in which it is no longer closely above the top surface of the substrate, so that the equilibrium conditions at the substrate surface correspond to those of the free gas space within the processing vessel.

The reaction gas employed for the process according to the invention is preferably a volatile compound of the semiconductor material. When producing silicon epitaxial layers upon silicon substrates, silicon tetrachloride $SiCl_4$, silico-chloroform $SiHCl_3$, or silicon bromide $SiBr_4$, may be used, for example. For the production of germanium members, the corresponding germanium-halogen compounds, such as $GeCl_4$ or $GeBr_4$, can be used. In each case the semiconductor-halogen compound is passed through the reaction vessel in mixture with a reaction gas or diluent, for which purpose hydrogen is preferably employed.

During the process, a substantially constant molar ratio of halogen-compound to hydrogen can be maintained. For example, when employing a mixture of $SiCl_4$ or $SiHCl_3$ with hydrogen ($H_2$), the molar ratio may be maintained at a constant value of 0.01 to 0.05 during the first stage of the process in which material is being removed from the substrate surface, as well as during the second processing stage in which the epitaxial silicon layer is being grown on the substrate.

According to another mode of performing the method of the invention, however, the molar ratio between the volatile semiconductor compound and hydrogen is kept at higher values during the first material-removing stage of the process than during the subsequent layer-growing second stage.

When operating with a mixture of semiconductor-halide and hydrogen, the reaction occurring during the first stage of the process results in the evolution of halogen hydride in the immediate vicinity of the heated substrate surface. It is preferable to adjust the reaction conditions resulting from the temporary shielding effect of the mechanical cover structure in the reaction space, so that the amount of halogen hydride evolving up to the beginning of the second reaction stage has reached a sufficient quantity to prevent undesired doping of the now precipitating semiconductor layer by impurities that may stem from the wall or other components of the reaction vessel, preferably any doping by precipitation of boron. In other words, the reaction conditions during the first stage of the process are preferably so adjusted that no free halogen hydride need be added to the reaction gas passing into the reaction vessel.

Also by virtue of the temporary shielding effective between the substrate surface and the major portion of the reaction space, the gas flow conditions during the first reaction stage can be readily adjusted so that the dopant substances contained within the reaction vessel for doping the epitaxial layer are prevented from being precipitated upon the substrate, so that such desired dopants can precipitate, together with the evolving semiconductor material, only during the second stage of the process.

Suitable as material for the cover plate are any substances that do not introduce impurities into the gas space or upon the substrates and that possess a sufficiently large adhesion with respect to semiconductor material which reaches the surface of the cover plate by virtue of the transport reaction. These requirements are satisfied by various materials which are inert with respect to the reactions, for example graphite, spectral carbon, or quartz. It is also of advantage to make the cover plates of the same semiconductor material as is being transported by the reaction. However, it is sufficient in this respect if the cover plate consists of a core of any suitable material, for example graphite or other carbon, and is coated with the semiconductor material to be processed in the vessel.

According to a further feature of the invention, a plurality of substrates are simultaneously provided with epitaxial layers under control by a single shielding or cover plate, which is provided with slots or other openings that permit a gas exchange between the narrow, inner reaction space between the substrates and the cover plate on the one hand the the surrounding gas space in the reaction vessel on the other hand.

The method of the invention is applicable for processing substrates having surfaces which are highly polished mechanically, as well as substrates with lapped surfaces. The duration of the first processing stage, during which a material-removing or etching operation takes place, depends upon the composition of the reaction gas and also upon the distance of the cover plate from the substrate surface.

The invention will be further described with reference to the example illustrated on the accompanying drawings in which.

Figures 1, 2, 3:
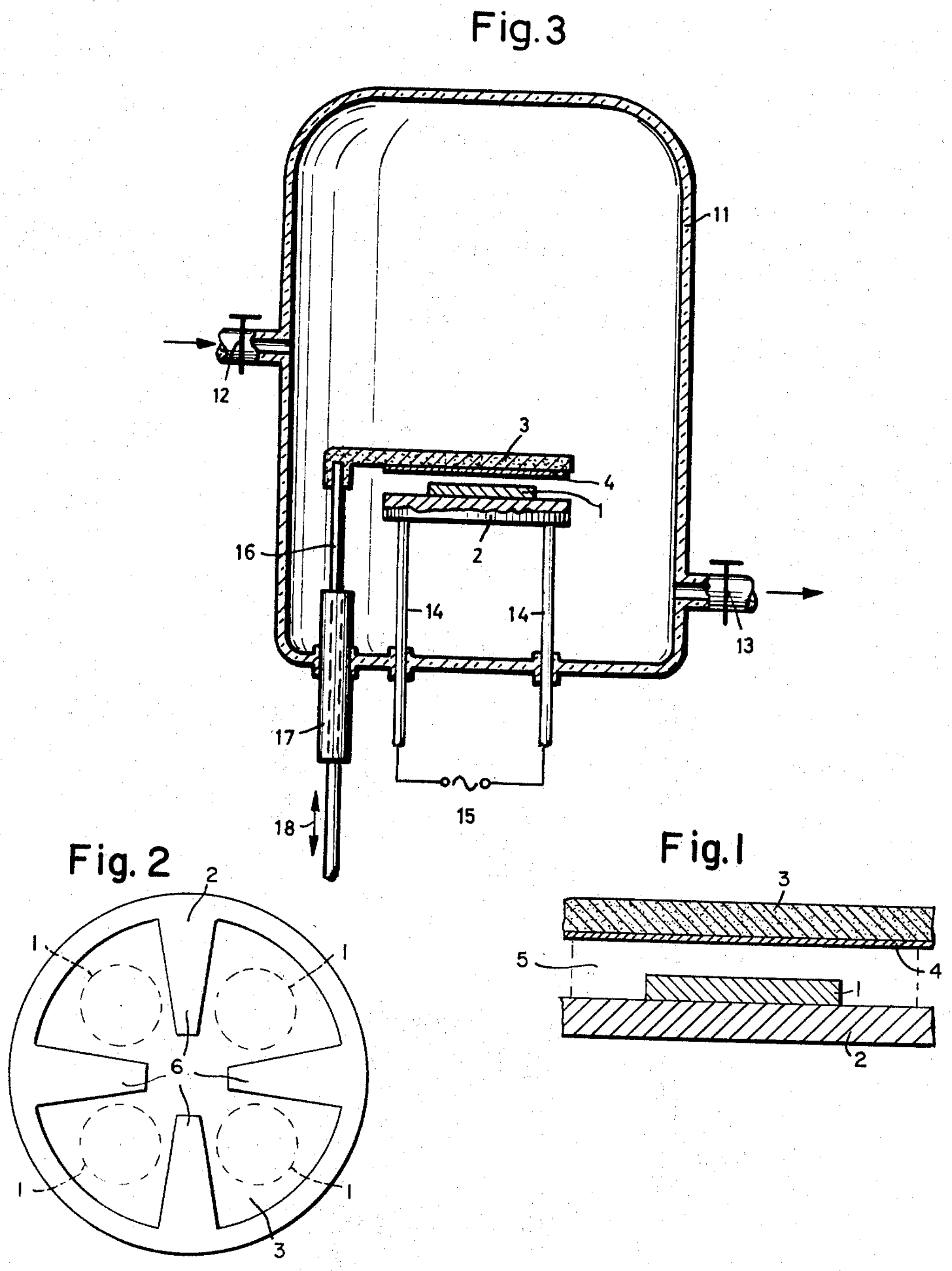
FIG. 1 shows in vertical section a substrate in relation to a mechanical cover plate in the position occupied during the first processing stage.
FIG. 2 is a top view onto four substrates and a cover structure shown likewise in the position occupied during the first processing stage.
FIG. 3 shows schematically and in section a processing vessel with a substrate and cover-plate assembly according to FIG. 1.

As exemplified in FIG. 1, a preferably monocrystalline disc 1 of silicon or other semiconductor material is placed flat upon the planar top surface of a directly or indirectly heated carrier 2 likewise consisting of silicon. The substrate 1 is thus heated to a temperature of 1200° to 1250° C. A cover plate 3 of inert material, for example carbon, is located above the carrier 2. The cover plate has planar shape and its bottom surface extends in parallel relation to the top surface of the carrier 2 and hence also to the top surface of the substrate 1. The bottom side of the cover plate 3 is provided with a dense coating 4 of the semiconductor material consisting, in this case, of silicon. The distance between the surface of the silicon coating 4 and the top surface of the substrate 1 is 0.1 to 1 mm.

According to FIG. 3, the carrier 2 and the cover plate 3 are mounted inside the reaction vessel 11 of quartz which is equipped with inlet and outlet nipples having respective valves 12 and 13 for supplying and discharging the reaction-gas mixture. The carrier 2 according to FIG. 3 is heated by directly passing electric current therethrough. For this purpose, the carrier is mounted on current supply conductors 14 which extend to the outside of the reaction vessel where they are connected to a voltage source at 15. The cover plate 3 is mounted on a rod 16 which is vertically displaceable in a guide 17 through which the rod 16 passes to the outside of the vessel in sealed relation to the reaction space. The rod can be displaceable in the vertical direction as indicated by an arrow 18. The displacement may be effected by hand or by means of a motor (not shown).

During the first stage of the process the cover plate 3 is moved close to the substrate 1 so as to maintain the above-mentioned narrow spacing of 0.1 to 1 mm. The reaction is then performed while carrier 2 is heated by electric current to the above-mentioned pyrolytic temperature of 1200 to 1250° C. and a flow of gas is maintained through valves 12 and 13. This gas may consist of silicon-halide and hydrogen and may contain a slight addition of dopant. If the substrate 1 has n-type conductance, the dopant may consist of a gaseous halogen compound of boron or indium at the same dopant concentration as the one desired in the p-type layer to be grown on the monocrystalline substrate.

During the first reaction stage, the quasi-stationary conditions obtaining in the narrow space between the cover plate and the substrate 1 are such that material from the substrate surface is etched away and becomes precipitated upon the bottom side of the cover plate 3. Since no precipitation upon the substrate takes place, the dopant contained in the reaction gas remains ineffective, any penetration of dopant into the narrow reaction space between the cover plate being prevented by the evolving silicon hydride. When the first stage is completed, the rod 16 is moved upwardly, thus shifting the cover plate so far away from the substrate 1 that the cover plate becomes ineffective and the substrate surface is exposed to the reaction conditions existing in the free gas space within the reaction vessel 11. Under these conditions, the reaction gas is pyrolytically dissociated and the evolving silicon precipitates upon the heated substrate surface together with the dopant, thus forming a monocrystalline p-type layer upon the substrate.

The cover arrangement shown in FIG. 2 permits the simultaneous processing of several substrate discs. The semiconductor substrates 1 are placed upon the top surface of a heated carrier 2 in the same manner as described above with reference to FIG. 1. The cover plate 3 located above the substrates is provided with radial slots 6 for improving the gas exchange between the interior reaction space covered by the plate and the surrounding space in the interior of the reaction vessel. The number and shape of the slots is not essential and can be adapted to the particular reaction requirements such as the number of substrates to be covered. In all other respects the cover plate 3 according to FIG. 2 is mounted and operated in the same manner as explained above with reference to FIG. 3. It will be understood, however, that, if desired, the cover plate or other shielding structure may also be turned away from its active position rather than be shifted vertically in the manner described above. For example, the plate 3 according to FIG. 3 may be turned away from the illustrated active position about the axis of shaft 16, although in such cases a larger cross section of the reaction vessel may be required.

As mentioned, the above-described example relates to the production of monocrystalline silicon layers upon a monocrystalline substrate of the same material. The substrate used for this purpose is made of n-doped monocrystalline silicon whose surface is mechanically polished. Before commencing the reaction, the substrate is annealed in hydrogen for about 10 minutes. Then the silicon disc is heated by means of its carrier to the above-mentioned pyrolytic temperature of 1200 to 1250° C. If desired, the heating of the carrier may also be effected by induction heating.

Used as a reaction gas is a mixture of $SiCl_4$ and hydrogen, or a mixture of $SiHCl_3$ and hydrogen. The molar ratio of silicon-halide to hydrogen is 0.01 to 0.05 when using $SiCl_4$. The molar ratio, however, is preferably kept at approximately 0.05 when $SiHCl_3$ is being employed. As described, the process is performed with a continuous flow of the reaction gas through the vessel so that spent gases are being continuously eliminated. The pressure in the vessel during the process is approximately 1 atmosphere.

By virtue of the cover plate extending above the silicon substrate at a distance of 0.1 to 1 mm. and consisting, in the above-described example, of a carbon plate coated with silicon, the quasi-stationary condition, which develops in the narrow space between the silicon substrate and the silicon surface of the cover plate, is such that material is eliminated from the substrate surface in accordance with the reaction equation $$Si+2HCl \rightarrow SiCl_2+H_2$$

The hydrogen chloride required for this elimination stage is not supplied from the outside into the reaction vessel but evolved from the dissociation reaction occurring in the other regions of the reaction space, particularly at the heated carrier surface not covered by the cover plate:

$$SiCl_4+2H_2 \rightarrow Si+4HCl$$

or $$SiHCl_3+H_2 \rightarrow Si+3HCl$$

By virtue of the fact that the hydrogen chloride evolves within the reaction vessel itself, any introduction of impurities, as may result from an extraneous supply of hydrogen chloride, is prevented.

As soon as the desired elimination of material from the substrate surface has taken place, the cover plate is removed. This is done when the thickness of eliminated substrate material is about 10 microns for mechanically polished surfaces, or about 50 microns when the substrate surface is lapped. The required duration of the first processing stage depends upon the thickness of material to be thus eliminated. For example, the duration is about 10 minutes for removing a thickness of 10-micron material, and approximately 40 minutes if a thickness of 50 microns is to be removed. After the cover plate is moved away from the substrate surface, the equilibrium existing in the free gas space also becomes effective at the heated substrate surface so that now the growth of precipitating silicon on the substrate surface commences.

The layers thus grown can be given the same or opposite doping compared with the conductance type of the substrate, depending upon the choice of the dopant substances added to the reaction gas.

Since in the process according to the invention the growth of the epitaxial layer during the second reaction stage commences immediately upon the freshly etched substrate surface without removal of the substrates from the processing vessel, the invention affords a particularly simple manufacturing operation because all of the method steps require using only one reaction vessel. This also excludes the possibility that impurities may enter from the outside as may happen if the reaction vessel must be changed. Above all, the invention has the advantage that it permits the production of particularly good p-n junctions not only because of the improvement in planar condition and crystalline constitution at the substrate surface, but also because the dopant substances contained in the reaction gas can reach the substrate surface only after termination of the material-eliminating first processing stage. Only when the second processing stage commences and semiconductor material is being precipitated upon the substrate surface, can the doping substances, contained at a given concentration in the reaction gas mixture, precipitate together with the semiconductor material upon the substrate surface so that the growing epitaxial layer also contains the dopant in the corresponding concentration. In this manner, inhomogeneities of the dopant concentration within the epitaxial layer are largely eliminated. Furthermore, any undesired doping by impurities as may be contained in the reaction gas, for example p-doping by any boron content, is reliably prevented during the first reaction stage, due to the presence of halogen-hydride in the narrow internal shielded space adjacent to the substrate surface.

The layers grown in this manner attain an extremely high degree of crystalline perfection.

Another advantage is the fact that, when layers of the same doping as the substrate are being grown, an undesired reverse doping at the beginning of the precipitating operation is prevented by virtue of the then relatively high hydrogen chloride concentration.

The method of the invention can also be used as a pure etching process, by discontinuing the reaction upon completion of the first reaction stage, and hence before commencing the layer-growing stage.

I claim:

1. The process of producing semiconductor members selected from the group consisting of silicon and germanium by thermally dissociating a gaseous compound of the semiconductor material and precipitating it as a layer upon a heated substrate of semiconductor material, which comprises adjusting and maintaining during a first processing stage the equilibrium conditions of the reaction by bringing an inert cover plate, in the reaction space above and near the substrate surface thereby forming a quasi-stationary substrate-dissolving condition so as to eliminate part of the substrate surface, and thereafter, in a second processing state removing said cover plate thereby shifting the reaction equilibrium to effect precipitation of the semiconductor material upon the substrate.

2. The process of epitaxially growing monocrystalline layers of semiconductor material, selected from the group consisting of silicon and germanium, upon monocrystalline substrates of the same material by thermal dissociation of gaseous compound of the material and precipitation of the layer material upon the heated substrates, which comprises placing the monocrystalline substrates upon the top surface of a heated carrier in a reaction vessel and supplying to the vessel a mixture of hydrogen and a gaseous halogen compound of the semiconductor material; maintaining, during a first processing stage, an inert cover structure above, and upwardly spaced from, the substrate top surface, thereby covering the substrate and maintaining a reaction equilibrium at the substrate under substrate-dissolving conditions so as to eliminate material from the substrate top surface; and thereafter, in a second processing stage, removing the inert cover structure thereby uncovering the substrate and maintaining the reaction equilibrium under material-precipitating conditions.

3. The pyrolytic process of growing epitaxial semiconductor crystal layers, selected from the group consisting of silicon and germanium, upon semiconductor substrates, which comprises placing the substrates upon the top surface of a heated carrier in a reaction vessel and supplying to the vessel a mixture of hydrogen and a gaseous halogen compound of the semiconductor material; maintaining during a first processing stage a displaceable cover plate in a covering position upwardly spaced from the substrate top surface to form therewith a gap space in which the reaction equilibrium is maintained at a substrate-dissolving condition to remove material from the substrate top surface; and thereafter moving the cover plate to a position away from the substrate to expose the substrate top surface, thereby maintaining in a second processing stage the reaction equilibrium at material-precipitating conditions.

4. The epitaxial semiconductor growing process according to claim 3, wherein said cover plate has a planar bottom side parallel to the substrates and facing the substrates.

5. The epitaxial semiconductor growing process according to claim 4, wherein the spacing between the cover plate and the substrates in the first processing stage is kept at 0.1 to 1 mm.

6. The epitaxial semiconductor growing process according to claim 2, which comprises maintaining a substantially constant molar ratio of semiconductor-halide to hydrogen during both stages of the reaction.

7. The epitaxial semiconductor growing process according to claim 6, wherein said semiconductor material is silicon and said compound is gaseous silicon-chlorine compound, the value of said constant compound-to-hydrogen molar ratio being 0.01 to 0.05.

8. The epitaxial semiconductor growing process according to claim 2, which comprises maintaining during said first stage the halide-to-hydrogen molar ratio higher than during the subsequent precipitation stage.

9. The epitaxial semiconductor growing process according to claim 2, which comprises supplying a reaction gas composed of gaseous semiconductor-halide and hydrogen so that halogen hydride evolves from the reaction during said first stage, and terminating the first stage upon formation of sufficient halogen hydride in the vessel to thereby prevent undesired doping by impurities from vessel components.

10. The epitaxial semiconductor growing process according to claim 2, which comprises supplying a reaction gas composed of gaseous semiconductor-halide and hydrogen so that halogen hydride evolves from the reaction during said first stage, and adjusting the equilibrium conditions during said first stage for producing a sufficient amount of halogen hydride to prevent precipitation of dopants upon the substrate during said first stage.

11. The epitaxial semiconductor growing process according to claim 3, wherein said cover plate consists of the same semiconductor material as the one being precipitated.

12. The epitaxial semiconductor growing process according to claim 3, wherein said cover plate consists of inert material from the group consisting of pure carbon and quartz.

13. The epitaxial semiconductor growing process according to claim 3, wherein said cover plate is coated with semiconductor material.

14. The epitaxial semiconductor growing process according to claim 3, which comprises simultaneously processing a plurality of substrates placed upon said heated carrier, and employing a cover plate having a plurality of openings through which said gap space communicates with the surrounding gas space of said reaction vessel when said cover plate is in said covering position.

15. Apparatus for growing epitaxial semiconductor crystal layers upon semiconductor substrates, comprising a reaction vessel having supply and outlet means for a reaction gas mixture, a heatable carrier mounted in said vessel and having a planar horizontal top surface for supporting and heating the substrates, a cover structure, holder means on which said cover structure is mounted in said vessel, said holder means being movable for displacing said cover structure between a covering position and an inactive position, said cover structure having a planar bottom surface of semiconductor material parallel to said carrier top surface and upwardly spaced from the supported substrates a distance of 0.1 to 1 mm. when said cover structure is in said covering position to then provide at said substrates a reaction equilibrium at which the gas causes removal of surface material from the substrates, said cover plate being remote from said top surface so as to permit a reaction equilibrium under layer-growing conditions when said plate is in said inactive position.

References Cited

UNITED STATES PATENTS

| | | | |
|---|---|---|---|
| 3,140,965 | 7/1964 | Rueschel | 148—175 |
| 3,142,596 | 7/1964 | Theuerer | 148—175 |
| 3,148,094 | 9/1964 | Kendall | 148—175 |
| 3,172,792 | 3/1965 | Handelman | 148—175 |

FOREIGN PATENTS

| | | |
|---|---|---|
| 1,364,466 | 5/1964 | France. |
| 1,374,096 | 8/1964 | France. |

DAVID L. RECK, *Primary Examiner.*

N. F. MARKVA, *Assistant Examiner.*